(12) United States Patent
Kuebart et al.

(10) Patent No.: US 6,389,706 B1
(45) Date of Patent: May 21, 2002

(54) WAFER CONTAINER HAVING ELECTRICALLY CONDUCTIVE KINEMATIC COUPLING GROOVE, SUPPORT SURFACE WITH ELECTRICALLY CONDUCTIVE KINEMATIC COUPLING PIN, TRANSPORTATION SYSTEM, AND METHOD

(75) Inventors: Gregor Kuebart, Dresden; Michael Lering, Bubenreuth; Sven Hahn, Dresden, all of (DE)

(73) Assignee: Motorola, Inc., Schaumburg, IL (US)

( * ) Notice: Subject to any disclaimer, the term of this patent is extended or adjusted under 35 U.S.C. 154(b) by 73 days.

(21) Appl. No.: 09/641,143

(22) Filed: Aug. 17, 2000

(51) Int. Cl.[7] .................................................. G01B 7/30
(52) U.S. Cl. ........................ 33/645; 33/613; 340/686.2
(58) Field of Search ................................ ; 33/613, 623, 33/645; 248/542; 414/935; 340/568.01, 568.4, 686.2; G01B 7/30

(56) References Cited

U.S. PATENT DOCUMENTS

| 3,284,910 A | * | 11/1966 | Klasek | 340/686.2 |
|---|---|---|---|---|
| 5,138,772 A | * | 8/1992 | Barnes | 33/613 |
| 5,456,018 A | * | 10/1995 | Irlbeck et al. | 33/645 |
| 6,008,727 A | | 12/1999 | Want et al. | 340/572.1 |
| 6,010,008 A | | 1/2000 | Nyseth et al. | 206/711 |
| 6,010,009 A | | 1/2000 | Peterson et al. | 207/711 |
| 6,085,967 A | * | 7/2000 | Grande et al. | 414/935 |
| 6,151,792 A | * | 11/2000 | Ohlig et al. | 33/645 |

FOREIGN PATENT DOCUMENTS

| WO | WO99/50577 | 10/1999 | F16J/15/02 |
|---|---|---|---|

* cited by examiner

Primary Examiner—G. Bradley Bennett

(57) ABSTRACT

A transportation system (100/200) has a wafer container (100), such as a FOUP, to rest on a support surface (200). The container has kinematic coupling grooves, and the support surface has kinematic coupling pins. Grooves and pins are at least partially electrically conductive and allow coupling an electric device (150) associated with the container to an electrical circuit (250) associated with the support surface. Device and circuit in combination allow to perform a variety of functions, such as monitoring the correct position of the container, and exchanging signals.

14 Claims, 3 Drawing Sheets

—PRIOR ART—

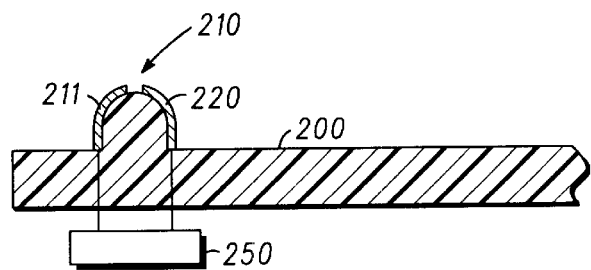
FIG. 5
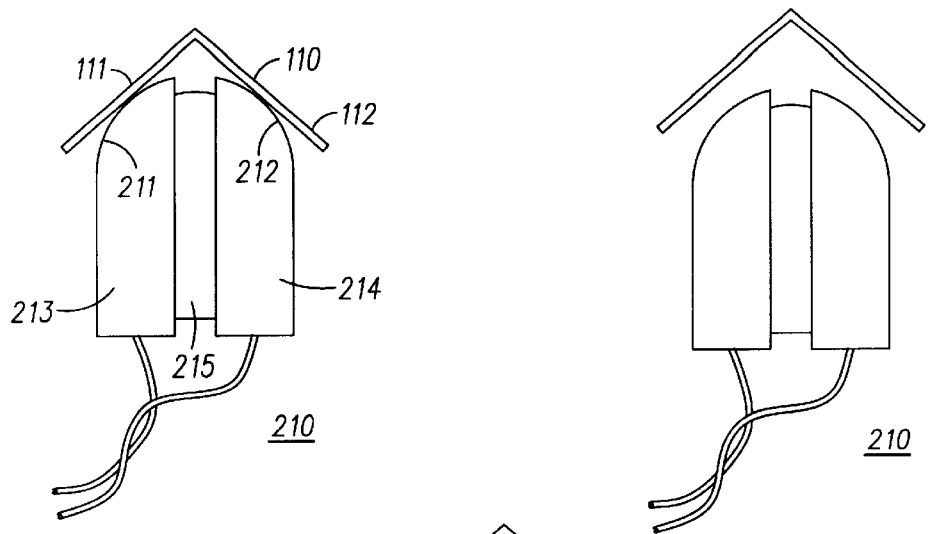
FIG. 6A
FIG. 6B
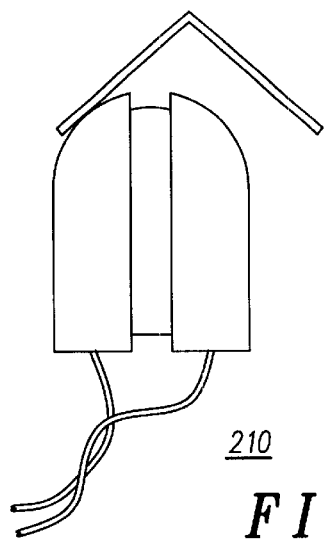
FIG. 6C

WAFER CONTAINER HAVING ELECTRICALLY CONDUCTIVE KINEMATIC COUPLING GROOVE, SUPPORT SURFACE WITH ELECTRICALLY CONDUCTIVE KINEMATIC COUPLING PIN, TRANSPORTATION SYSTEM, AND METHOD

RELATED APPLICATION

This Application relates to the U.S. Application Ser. No. 09/641,153 filed Aug. 17, 2000 entitled, "Wafer Container Having Electrically Conductive Kinematic Coupling Groove To Detect The Presence Of The Wafer Container On A Support Surface, The Support Surface, and Method" and assigned to Semiconductor 300 Gmbtt & Co., Infineon Technologies AG and Motorola, Inc.

FIELD OF THE INVENTION

This invention relates to carriers for semiconductor wafers, and more particularly, relates to a container for transporting and storing wafers.

BACKGROUND OF THE INVENTION

In semiconductor industry, wafers have to be carefully carried between processing stations. Currently there is a trend to carry them in a container, such as, for example, in a Front Opening Unified Pod (FOUP).

FIG. 1 illustrates a simplified cross-section diagram of a conventional transportation system with FOUP 10 and support surface 20. FOUP 10 comprises slots to hold a plurality of wafers, robotic lifting flange 17 and manual lifting handles 16 for moving the FOUP.

FOUP 10 temporarily rests with its base plate 19 on support surface 20 of the processing equipment, such as a load port, a container shelf within a buffer or a stocker, or elsewhere. A transportation vehicle can also have such a support surface 20.

In order to align the position of FOUP 10 to the processing equipment with surface 20, kinematic coupling is used. A set of kinematic coupling grooves 11, 12 (only 2 of 3 shown) in the base plate 19 of FOUP 10 engages with kinematic coupling pins 21, 22 in support surface 20 (only 2 of 3 shown). Grooves 11, 12 settle over pins 21, 22 to establish points of mechanical contact. The dimension of the grooves and of the pins are standardized so that FOUPs of various suppliers are compatible with each other (SEMI E 57 "Mechanical Specification for Kinematic Couplings used to align and support 300-mm Wafer Carriers").

There are instances where the FOUP is not placed on the support surface as specified in the standard. Hence, there is a need to monitor the FOUP placement.

BRIEF DESCRIPTION OF THE DRAWINGS

FIG. 5 is a simplified cross-section diagram of a support surface with a kinemato-electric coupling pin; and FIGS. 6ABC are simplified cross-section diagrams for an application that uses the pin of FIG. 5.

DETAILED DESCRIPTION OF PREFERRED EMBODIMENTS

Figure 2:
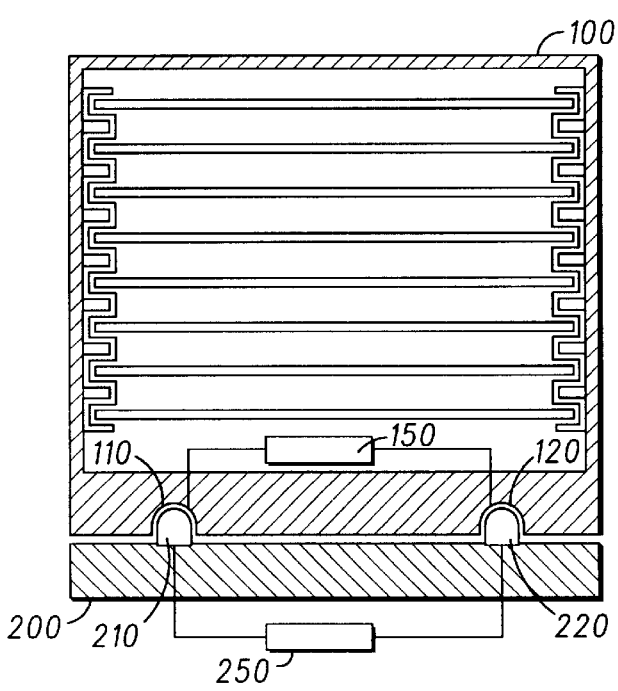
FIG. 2 is a simplified cross-section diagram of a new transportation system with a wafer container and a support surface according to the present invention.

FIG. 2 is a simplified cross-section diagram of a new wafer transportation system 100/200 with wafer container 100 and support surface 200 according to the present invention. Kinematic coupling grooves 110, 120 and kinematic coupling pins 210, 220 are at least partially electrically conductive; in other words, "kinemato-electric" grooves and pins are presented.

Grooves 110, 120 in container 100 and pins 210, 220 on support surface 200 (for holding container 100) do not only kinematically position container 100 in respect to support surface 200, but also allow to electrically couple electric device 150 ("device") associated with container 100 to electrical circuit 250 associated with support surface 200.

Preferably, device 150 is located within container 100 or attached to the outside; circuit 250 is preferably, located outside surface 200. For simplicity, FIG. 2 does not illustrate the wafers, the lifting flange, and the manual lifting handles.

As mentioned above, the number and the shape of grooves and kinematic coupling pins is standardized (e.g., 3 grooves/pins). By the present invention, number and shape remain unchanged. In other words, with mechanical handling and automation interfaces substantially unchanged, the transportation system of wafer container and support surface is down-compatible to existing technology.

Although the following description uses for simplicity only the term "kinematic coupling pin", it is intended that registration pins (SEMI standard E62) can also be used to practice the present invention.

Figure 3:
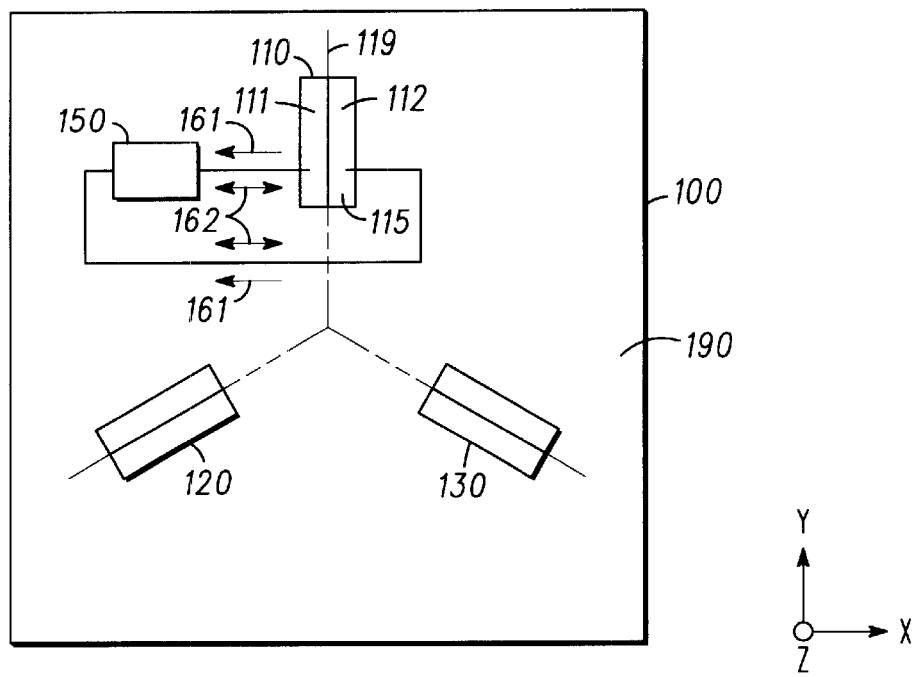
FIG. 3 is a simplified diagram of the wafer container according to the present invention.

FIG. 3 is a simplified diagram of wafer container 100 ("container") according to the present invention, viewed from below. Preferably, container 100 is Front Opening Unified Pod (FOUP); but this is not essential so that the present invention can also be applied to other types of containers. Container 100 is particularly advantageous when used to hold semiconductor wafers having, for example, a diameter of 300 mm or more. Different diameters (larger or smaller) can also be used.

In base plate 190, container 100 has at least first kinematic coupling groove 110 ("groove") with first groove surface 115. Groove 110 and further kinematic coupling groves 120 and 130 are provided to couple with kinematic coupling pins on support surface 200 (cf. FIG. 2, pin 210 with groove 110). Groove surface 115 has at least first electrically conductive portion 111 that is electrically coupled to electrical device 150 ("device") located inside or outside wafer container 100.

As illustrated in the embodiment of FIG. 3, groove surface 115 of groove 110 has second electrically conductive portion 112 that is substantially electrically isolated from first electrically conductive portion 111 and that is also electrically coupled to electrical device 150. Conveniently, electrically conductive portions 111 and 112 are arranged symmetrically in respect to groove symmetry line 119 (illustrated by point-dashed line).

Optionally, device 150 receives power via electrically conductive portions 111 and 112 from circuit 250 (indicated by arrows 161 to device 150); in other words, circuit 250 (cf. FIG. 2) can be a power supply. It is an advantage of the present invention, that battery power for device 150 is not required. However, the present invention does not preclude the use of a supply battery to power device 150.

Optionally, device 150 transmits signals that represent information via electrically conductive portions 111 and 112. Depending on the application, signal transmission can be unidirectional or bi-directional (cf. arrows 162 to and from device 150). When both options are used, device 150 receives power and transmits signals either consecutively (e.g., by time slots) or simultaneously (e.g., signal superimposition, frequency separation).

Conveniently, device 150 is a microprocessor, a stand-alone sensor, any other combination of passive or active electrical device or a combination of microprocessor, sensor and other passive or active electrical devices. Device 150 can implement a variety of functions, such as, for example, and without the intention to be limiting, monitoring physical and other characteristics in container 100, for example, pressure, temperature, organic contamination, inorganic contamination, vacuum, nitrogen (after purging), monitoring leakage of gases from the container; storing wafer related information such as process history, wafer identification, process parameters for earlier or future process steps, routing (local wafer-in-process database); counting the wafers; as well as other functions.

Monitoring and storing data can also be related to the container itself (e.g., cleaning history of the wafer, checking proper door closing, relative or absolute carrier location in the production facility ("fab")).

Persons of skill in the art can also electrically couple other electrical devices to the grooves without departing from the present invention. Device 150 can be assembled to container 100 during manufacturing, e.g., during molding the base plate 190. Alternatively, device 150 can be mounted on container 100 after container manufacturing and can be removed if desired (temporarily mounting). Optionally, device 150 and container 100 have their own mechanical, physical and electrical interface design that provides interoperability and exchangeability.

Figure 4:
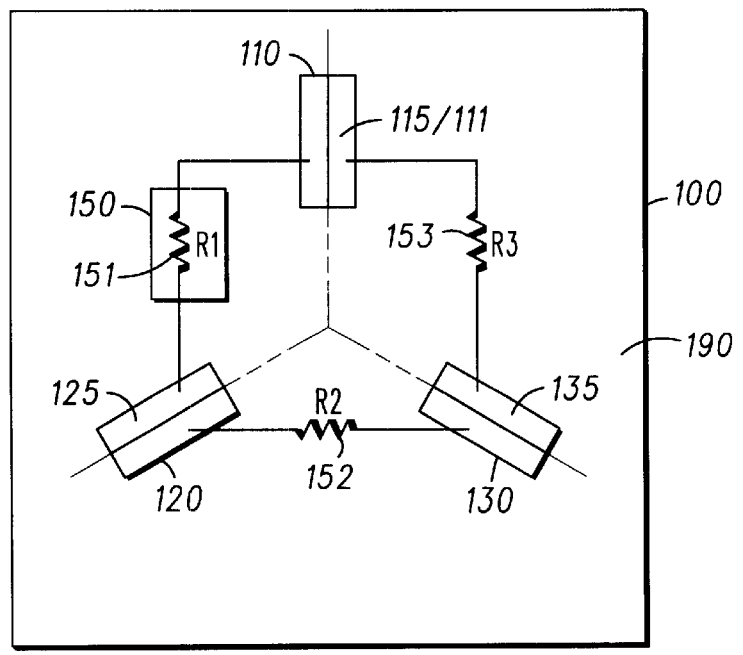
FIG. 4 is a simplified diagram of the wafer container in an alternative embodiment.

FIG. 4 is a simplified diagram of wafer container 100 in an alternative embodiment. Having a groove with separated conductive surfaces (cf. FIG. 3) is convenient, but not essential. Container 100 has molded in base plate 190 kinematic coupling groove 120 with groove surface 125 that is at least partially electrically conductive and electrically coupled to device 150. Preferably, conductive portion 111 in groove 110 (cf. FIG. 3) covers a larger area than in the embodiment of FIG. 3.

In an application to check the positioning of container 100 on surface 200 (cf. FIG. 2), device 150 is formed by electrical conductive path 151 extending from groove surface 115 to groove surface 125. The presence of container 100 in the predetermined position on support surface 200 provides an electrically conductive loop with circuit 250. The electrical resistance R1 between grooves 110, 120 and hence between kinematic coupling pins 210, 220 of support surface 200 (cf. FIG. 2) is predetermined. In other words, device 150 (i.e. path 151) is formed by base plate 190. Conveniently, FIG. 4 also illustrates further paths 152, 153 between grooves 120/130 and 130/110, respectively (resistance R2, R3). FIG. 5 is a simplified cross-section diagram of support surface 200 with kinematic coupling pin 210 ("pin"). Pin 210 provides kinematic coupling with kinematic coupling groove 110 in a wafer container 100 (cf. FIGS. 2–4); pin 210 has first surface area 211 and second surface area 212 to kinematically couple to groove 110; area 211 is substantially electrically isolated from area 212. Isolation can be provided, for example, by making the complete body of pin 210 from a substantially isolating material. A further example is illustrated in connection with FIGS. 6ABC. Areas 211 and 212 are coupled to circuit 250 (cf. FIG. 2).

FIG. 5 also shows, at least partially, support surface 200. In other word, support surface 200 has at least first kinematic coupling pin 210 to couple to corresponding first kinematic coupling groove 110 in base plate 190 of wafer container 100 (cf. FIGS. 2–4). Support surface 200 is characterized by a pin 210 having at least first and second electrically isolated areas 211, 212 to exchange electrical signals with container 100 via first kinematic coupling groove 110.

Figure 1:
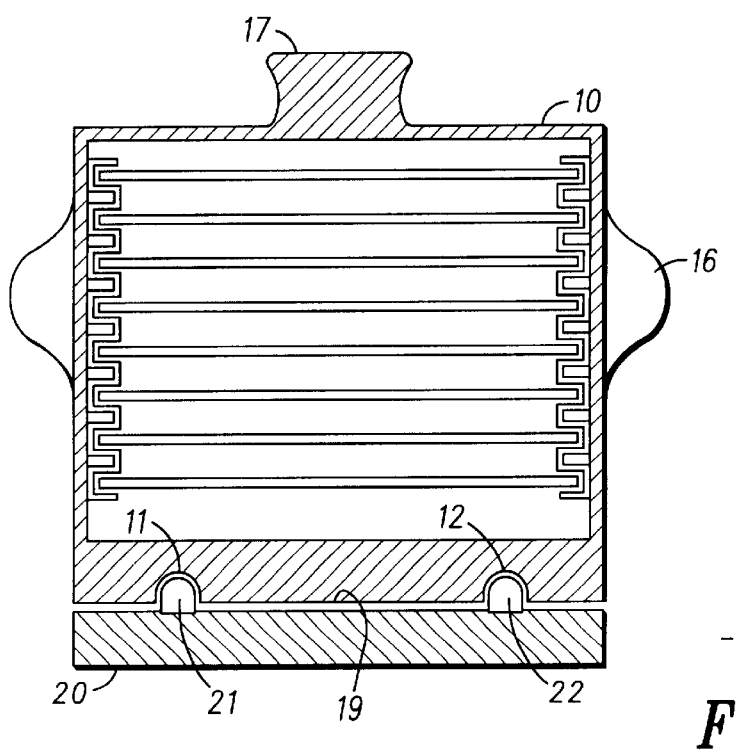
FIG. 1 illustrates a simplified cross-section diagram of a conventional transportation system with FOUP and support surface.

FIGS. 6ABC are simplified cross-section diagrams for an application that uses pin 210 of FIG. 5. In the example, pin 210 is shown with metal portions 213 and 214 (having surfaces 211, 212, respectively) that are isolated by isolation member 215. The application checks the proper position of container 100 on support surface 200. Shown from the A to C, groove 110 couples with pin 210 (normal case, FIG. 6A); grooves 110 does not couple with pin 210 at all (failure, FIG. 6B); and groove 110 does only partially couples with pin 210 (also failure, FIG. 6C). In the two failure cases, circuit 250 (cf. FIG. 1) determines that the electrical resistance between surfaces 211 and 212 is above a predetermined threshold and, preferably, issues a warning signal.

In other words, electrically isolated surface areas 211 and 212 of pin 210 are electrically coupled to evaluation circuit 250 (cf. FIG. 1) that measures the electrical resistance between areas 211 and 212 to indicate the kinematic coupling between groove 110 in container 100 when an electrical conductive path is established via area 211, groove 110 and second surface area 212.

In other words, viewing this application from the electrical device 150, that in FIGS. 6ABC is formed by groove surface 110 itself, the application is presented as follows: An electrical conductive path extending between electrically conductive portions 111 and 112 of groove 110, so that kinematic coupling of groove 110 with pin 210 (of surface 200) provides an electrically conductive loop having a predetermined resistance (e.g., substantially zero) between portions 111 and 112.

More generally, a predetermined resistance on one side (e.g., groove) is measured from a measurement device at the other side (e.g., pin). It is also within the scope of the invention to measure the resistance across a single-surface pin by device 150 (resistance sensor) across a double surface groove (cf. surfaces 111, 112 in FIG. 2).

Providing a pin with isolated surface areas 211, 212 is convenient, but not essential for the present invention. Returning in the explanation to FIG. 2, support surface 200 for holding container 100 has kinematic coupling pins 210 and 220 to couple to corresponding kinematic coupling grooves 110 and 120, respectively, in plate 190. Pins 210, 220 each are electrically conductive but electrically isolated from each other to exchange electrical signals with container 100 via kinematic coupling grooves 110 120 and 120.

In a container position sensing application, these electrical signals represent a measured resistance between pins 210 and 220 and thereby selectively indicate the presence or the absence of wafer container 100 on surface 200.

Having described details, a method for operating transportation system 100/200 (cf. FIGS. 2–6, wafer container 100 and support surface 200) is summarized as comprising the following first and second steps:

As a first step, wafer container 100 (plurality of kinematic coupling grooves 110, 120, 130, at least partially electrically conductive) is placed on support surface 200 (plurality of corresponding kinematic coupling pins 210, 220, 230, also at least partially electrically conductive) to kinematically couple the grooves with the pins; and as a second step, at least one step selected from a group of the following steps is executed:

measuring the electrical resistance across a single groove via a single pin (that has electrically isolated parts; cf. FIGS. 6ABC);

measuring the electrical resistance between two grooves via two corresponding pins (cf. FIG. 4);

sending power to an electrical device (e.g., device 150) within the wafer container from the single pin that has electrically isolated parts (cf. FIGS. 2, 3, 5);

sending power to the electrical device via two pins (cf. FIG. 2);

sending a signal from the electrical device via the single pin (that has electrically isolated parts, cf. FIGS. 3, 5, 6); and sending a signal from the electrical device via two pins (cf. FIGS. 2, 4).

To summarize the transportation system (e.g., container 100 with grooves and surface 200 with coupling pins), the system is characterized in that the grooves and the pins are at least partially electrically conductive to couple an electric device associated with the wafer container to an electrical circuit associated with the support surface.

While the invention has been described in terms of particular structures, steps, devices and materials, those of skill in the art will understand based on the description herein that it is not limited merely to such examples and that the full scope of the invention is properly determined by the claims that follow.

What is claimed is:

1. A wafer container having in a base plate at least a first kinematic coupling groove with a first groove surface, said wafer container characterized in that said first groove surface has a first electrically conductive portion that is electrically coupled to an electrical device in said wafer container.

2. The wafer container of claim 1 wherein said groove surface of said first kinematic coupling groove has a second electrically conductive portion that is substantially electrically isolated from said first electrically conductive portion and that is also electrically coupled to said electrical device.

3. The wafer container of claim 2 wherein said electrical device receives power via said first and second electrically conductive portions.

4. The wafer container of claim 3 wherein said electrical device transmits signals via said first and second electrically conductive portions.

5. The wafer container of claim 4 wherein said electrical device receives power and transmits signals consecutively or simultaneously.

6. The wafer container of claim 5, wherein said electrical device is a microprocessor.

7. The wafer container of claim 6, wherein said electrical device is a sensor.

8. Wafer container of claim 1 being a Front Opening Unified Pod (FOUP).

9. Wafer container of claim 2 wherein said first and second electrically conductive portions are arranged symmetrically in respect to a groove symmetry line.

10. The wafer container of claim 2 wherein said electrical device is an electrical conductive path extending between said first and second electrically conductive portions, so that kinematic coupling of said first groove with a kinematic coupling pin of a support surface provides an electrically conductive loop having a predetermined resistance between said first and second portions.

11. The wafer container of claim 1 having in said base plate a second kinematic coupling groove with a second groove surface, wherein said second groove surface is at least partially electrically conductive and electrically coupled to said electrical device.

12. A support surface for holding a wafer container, said support surface having first and second kinematic coupling pins to couple to corresponding first and second kinematic coupling grooves in a base plate of said wafer container, said support surface characterized in that said kinematic coupling pins each are electrically conductive but electrically isolated from each other to exchange electrical signals with said container via said first and second kinematic coupling grooves.

13. A method for operating a transportation system of a wafer container and a support surface, said method comprising the following first and second steps:

first, placing said wafer container having a plurality of kinematic coupling grooves that are least partially electrically conductive on said support surface that has a plurality of corresponding kinematic coupling pins that are also at least partially electrically conductive to kinematically couple said grooves with said pins, and second, at least one step selected from a group of the following steps:

sending power to an electrical device within said wafer container from a single pin that has electrically isolated parts;

sending power to said electrical device via two pins;

sending a signal from said electrical device via said single pin that has electrically isolated parts; and sending a signal from said electrical device via two pins.

14. Transportation system with a wafer container and support surface, said wafer container having kinematic coupling grooves, said support surface having kinematic coupling pins, said transportation system characterized in that said grooves and pins are at least partially electrically conductive to couple an electric device associated with said wafer container to an electrical circuit associated with said support surface.

* * * * *